United States Patent
Kuo et al.

(10) Patent No.: US 9,972,520 B2
(45) Date of Patent: May 15, 2018

(54) ALUMINUM NITRIDE ELECTROSTATIC CHUCK USED IN HIGH TEMPERATURE AND HIGH PLASMA POWER DENSITY SEMICONDUCTOR MANUFACTURING PROCESS

(71) Applicant: National Chung-Shan Institute of Science and Technology, Taoyuan (TW)

(72) Inventors: Yang-Kuao Kuo, Taoyuan (TW); Yi-Hsiuan Yu, Taoyuan (TW); Jian-Long Ruan, Taoyuan (TW)

(73) Assignee: NATIONAL CHUNG-SHAN INSTITUTE OF SCIENCE AND TECHNOLOGY, Taoyuan (TW)

( * ) Notice: Subject to any disclaimer, the term of this patent is extended or adjusted under 35 U.S.C. 154(b) by 212 days.

(21) Appl. No.: 14/943,290

(22) Filed: Nov. 17, 2015

(65) Prior Publication Data
US 2017/0140969 A1 May 18, 2017

(51) Int. Cl.
*H01T 23/00* (2006.01)
*H01L 21/683* (2006.01)
*H01J 37/32* (2006.01)
*H02N 13/00* (2006.01)

(52) U.S. Cl.
CPC ...... *H01L 21/6833* (2013.01); *H01L 21/6831* (2013.01); *H01J 37/3244* (2013.01); *H01J 37/32715* (2013.01); *H02N 13/00* (2013.01)

(58) Field of Classification Search
USPC .................................................. 361/234, 230
See application file for complete search history.

(56) References Cited

U.S. PATENT DOCUMENTS

| 6,538,872 | B1 * | 3/2003 | Wang | H01L 21/6833 361/103 |
| 2002/0050246 | A1 * | 5/2002 | Parkhe | H01L 21/67109 118/500 |
| 2008/0106842 | A1 * | 5/2008 | Ito | H01L 21/67028 361/234 |
| 2012/0320491 | A1 * | 12/2012 | Doh | H01L 21/6875 361/234 |

FOREIGN PATENT DOCUMENTS

JP 09-232415 A 9/1997
TW 098127179 B 2/2015

* cited by examiner

*Primary Examiner* — Danny Nguyen
(74) *Attorney, Agent, or Firm* — Chun-Ming Shih

(57) ABSTRACT

Disclosed is an aluminum nitride electrostatic chuck, comprising: a positioning electrostatic chuck and a carrier structure. The positioning electrostatic chuck includes a groove structure layer, a dielectric insulation layer, and a heat conduction layer. In the groove structure layer on the surface of the electrostatic chuck is provided with cooling gas channels, to facilitate control of the temperature distribution of a wafer. The electrostatic chuck is especially designed for use in a semiconductor manufacturing process of high temperature and high plasma power density. The dielectric insulation layer is provided with embedded electrodes, such that voltage conversion can be carried out to effect wafer absorption/release. The cooling gas channels are used to control temperature of the absorbed wafer, by means of heat conduction of aluminum nitride electrostatic chuck. Therefore, wafer temperature distribution is controlled through aspect ratio and geometry of cooling gas channel.

2 Claims, 4 Drawing Sheets

ALUMINUM NITRIDE ELECTROSTATIC CHUCK USED IN HIGH TEMPERATURE AND HIGH PLASMA POWER DENSITY SEMICONDUCTOR MANUFACTURING PROCESS

BACKGROUND OF THE INVENTION

Field of the Invention

The present invention relates to an electrostatic chuck, and in particular to an aluminum nitride electrostatic chuck used in high temperature and high plasma power density semiconductor manufacturing process.

The Prior Arts

In the early stage of manufacturing semiconductors, the plasma power density utilized is rather low, such that there is no need to perform cooling and temperature control for the wafer. However, in recent years, due to the progress and development of the technology and equipment of manufacturing semiconductors, the plasma power density utilized has increased markedly, so that it is imperative to perform cooling for the wafers, to raise the heat dissipation efficiency for the wafer clamp; otherwise, the temperature increase could damage the pattern structures on the wafer, hereby adversely affecting the subsequent manufacturing process.

Further, along with the increase of the wafer size, the conventional mechanical clamp used to hold wafer has quite a lot of problems, such as, Bowing and Deforming, Edge Exclusion (edge of wafer can not be utilized for being subjected to uneven force), Low Throughput, Complex Structure, Costly Maintenance, Contamination (wafer tends to produce minute particle contamination due to frictions with the mechanical clamp), and Short Life Span.

In order to solve the problems mentioned above, in manufacturing semiconductors, an electrostatic chuck (ESC) having a dielectric layer providing electrostatic force is used to replace the conventional mechanical clamp. In this electrostatic chuck (ESC), the electrostatic force is produced to absorb wafer. As such, in addition to redressing the problems mentioned above, it has the advantages of improving contact with wafer, and raising the heat conduction efficiency to enhance cooling. Further, it is not liable to expose directly to plasma, hereby achieving raised throughput, efficiency, and quality of the wafers produced.

In order to solve the surface heat conduction problem for the wafer, in Japanese Patent No. JP 09-232415, a means is used to provide heat conduction gas to the surface of the electrostatic chuck (ESC). Also, radiation type grooves are provided, and an overlapping structure of groove and electrode is used, to shorten the distance between the bottom of the groove and the electrode, in achieving better heat conduction and fast cooling. However, in case high voltage plasma is applied, that could induce gas electric discharge. In this case, even if dielectric insulation thin film is used for the surface of the electrostatic chuck (ESC), insulation failure may still occur. As such, high power density plasma can be applied to achieve electric insulation and control of high temperature in a manufacturing process, only under the condition that the whole set of ESC is made of electric insulation and heat conductive ceramic, and having a design of cooling gas channel.

Moreover, in Taiwan Patent No. 098127179 is disclosed a ceramic electrostatic chuck (ESC). On its surface is covered with a thin Aluminum Oxide layer as the main dielectric layer; while an insulation positioning chuck made of heat conductive ceramic is used to form a ceramic electrostatic chuck, having gas flow grooves. Yet, the disadvantages of it are that, for a composite layer produced in a high temperature manufacturing process, the composition layers contained therein tend to ablate. In addition, after long period of operation, the dielectric layer of aluminum oxide is liable to be worn out completely during wafer transfer, thus leading to short life span. Besides, heat transfer is hindered in the composite layer interface. As such, the durability of the electrostatic chuck (ESC) used in high temperature and high plasma power density manufacturing process is still an issue to cause concern. Therefore, the new generation wafer manufacturing process requires to use an electrostatic chuck, with its whole set made of dielectric ceramic having good electrical insulation and heat conduction, so that it can be operated in a high temperature and high plasma power density environment.

Therefore, presently, the design and performance of electrostatic chucks is not quite satisfactory, and they leave much room for improvement.

SUMMARY OF THE INVENTION

In view of the problems and drawbacks of the prior art, the present invention provides an aluminum nitride electrostatic chuck used in high temperature and high plasma power density semiconductor manufacturing process, to overcome the shortcomings of the prior art.

The present invention provides an aluminum nitride electrostatic chuck used in a high temperature and high plasma power density semiconductor manufacturing process. For the electrostatic chuck, a cooling gas channel is provided on its surface, to facilitate control of temperature distribution for the wafer. The electrostatic chuck includes a positioning electrostatic chuck, with its whole set formed by sintering aluminum nitride. The positioning electrostatic chuck includes: a groove structure layer, with its surface provided with cooling gas channels, having width 2 mm and depth 20~100 µm, and is used to absorb/release wafer and control heat distribution of the absorbed wafer; a dielectric insulation layer made of aluminum nitride, having one or more embedded high voltage electrodes, wherein the electrode includes electric conduction metal composite material, used to provide voltage to produce electrostatic force to absorb wafer; and a heat conduction layer made of aluminum nitride, having embedded water channels, to enhance temperature reduction of wafer. The electrostatic chuck further includes a carrier structure, made of metal, and is disposed below said positioning electrostatic chuck as a support for the positioning electrostatic chuck.

In the descriptions above, the voltage applied by the high voltage electrode is in a range of 2.0 KV to 3.0 KV.

The aluminum nitride electrostatic chuck (ESC) of the present invention is used in manufacturing semiconductor, to control the wafer temperature in the manufacturing process. In particular, in recent years, due to the progress and development of the related technologies, the plasma power density used in the semiconductor manufacturing process is increased. Also, along with the requirement of high temperature, high voltage, product precision, and production yield, the heat transfer speed between the chuck and wafer must be fast enough to meet the demand of the manufacturing process. Therefore, a new generation of dielectric ceramic material and product design capable of high heat conduction has to be developed. The present invention provides an electrostatic chuck, with its whole set made of aluminum nitride ceramic, for which electrostatic force is used to absorb the wafer and fix it to a right place on the electrostatic chuck. As such, the present invention is suitable to use in semiconductor manufacturing process, requiring high speed transfer of the components processed, such as wafer surface etching, and film plating process.

The present invention provides an aluminum nitride electrostatic chuck (ESC), utilized in high temperature and high plasma power density semiconductor manufacturing process, that is quite different from the electrostatic chuck utilized in the conventional low temperature wafer manufacturing process. In the present invention, the surface of this electrostatic chuck is designed to have a cooling gas channel to facilitate control of wafer temperature distribution. In such a design, the wafer temperature distribution is controlled through the aspect ratio (depth-width ratio) of cooling gas channel and the geometric distribution of cooling gas channel.

Further scope of the applicability of the present invention will become apparent from the detailed descriptions given hereinafter. However, it should be understood that the detailed descriptions and specific examples, while indicating preferred embodiments of the present invention, are given by way of illustration only, since various changes and modifications within the spirit and scope of the present invention will become apparent to those skilled in the art from this detailed descriptions.

BRIEF DESCRIPTION OF THE DRAWINGS

The related drawings in connection with the detailed descriptions of the present invention to be made later are described briefly as follows, in which.

DETAILED DESCRIPTION OF THE PREFERRED EMBODIMENT

The purpose, construction, features, functions and advantages of the present invention can be appreciated and understood more thoroughly through the following detailed description with reference to the attached drawings.

The present invention provides an aluminum nitride electrostatic chuck (ESC), utilized in high temperature and high plasma power density semiconductor manufacturing process. Wherein, the aluminum nitride electrostatic chuck includes a positioning electrostatic chuck, with its whole set formed by sintering of aluminum nitride; and a carrier structure.

Figure 1:
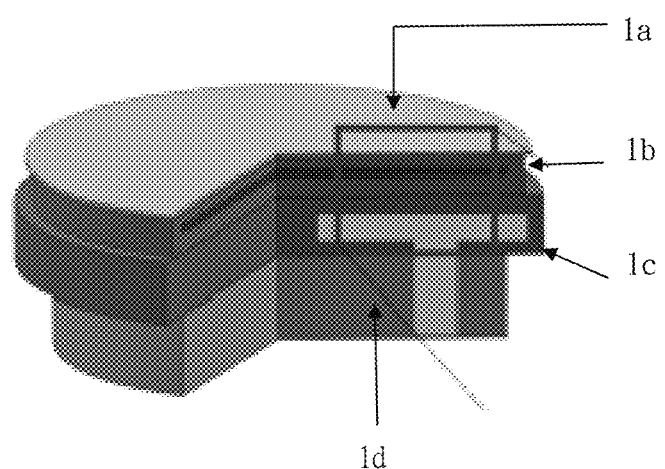
FIG. 1 is a cross section view of an aluminum nitride electrostatic chuck according to an embodiment of the present invention.

Firstly, refer to FIG. 1 for a cross section view of an aluminum nitride electrostatic chuck according to an embodiment of the present invention. As shown in FIG. 1, the aluminum nitride electrostatic chuck 1 includes a positioning electrostatic chuck, composed of the following three layers: a groove structure layer 1a having a cooling gas channel; a dielectric insulation layer 1b having one or more embedded high voltage electrodes; and a heat conduction layer 1c, having embedded water channels. The aluminum nitride electrostatic chuck 1 further includes a carrier structure 1d made of metal, preferably aluminum, and is disposed below the positioning electrostatic chuck as a support for the positioning electrostatic chuck.

Figure 2:
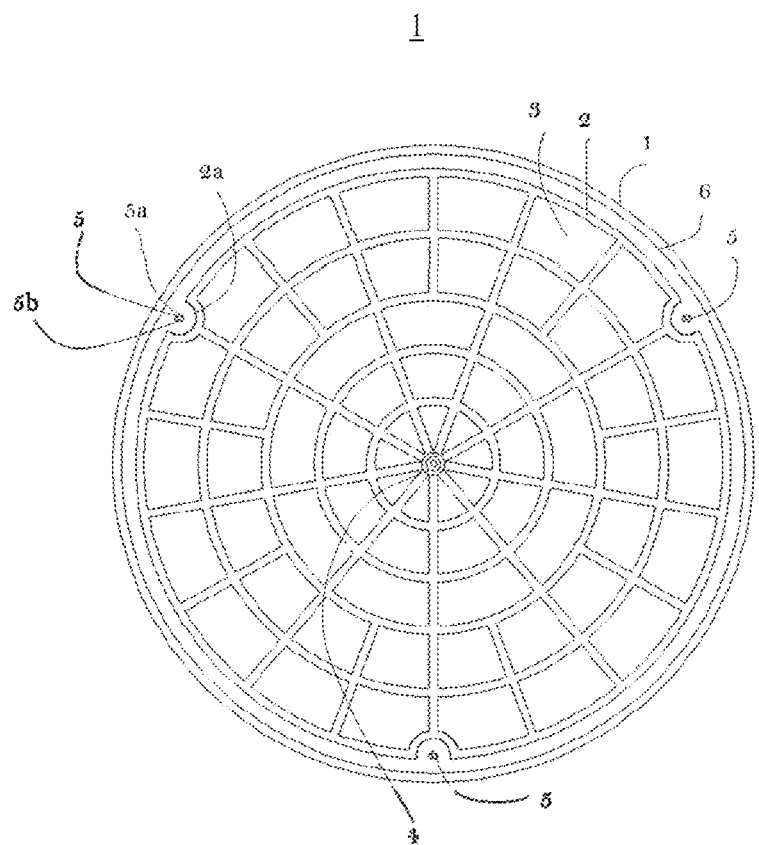
FIG. 2 is a top view of a groove structure layer according to an embodiment of the present invention.

Next, refer to FIG. 2 for a top view of a groove structure layer according to an embodiment of the present invention. As shown in FIG. 2, the groove structure layer 1a includes: a cooling gas channel 2 having width 2 mm and depth 20~100 μm; a contact surface 3 between the electrostatic chuck and the wafer; a cooling gas inlet 4; wafer elevation points 5; an upper surface 5a; a channel surface 5b; and an electrostatic chuck outer rim 6. Wherein, the cooling gas channel 2 is provided with a cooling gas channel outer surface 2a, while the cooling gas inlet 4 is used to input cooling gas.

Figure 3:
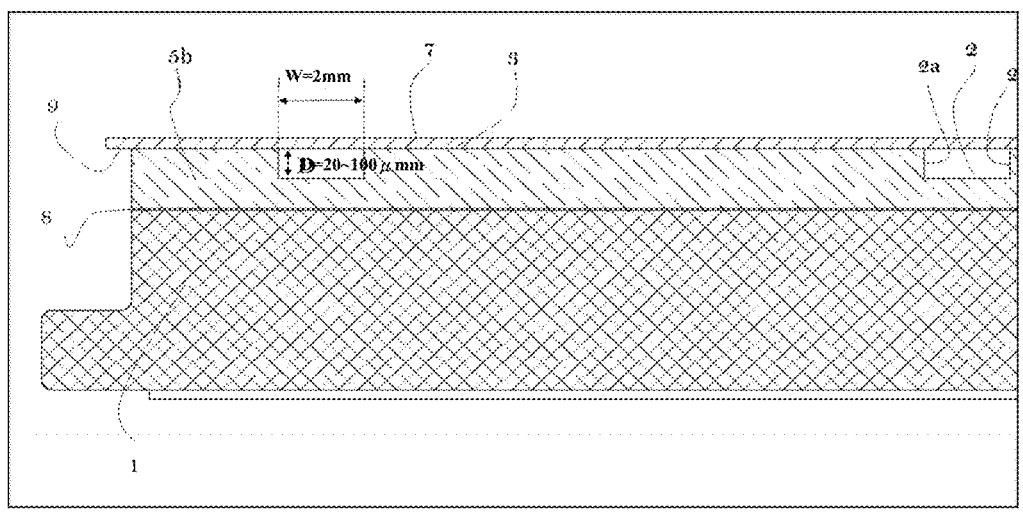
FIG. 3 is a cross section view of an aluminum nitride electrostatic chuck according to an embodiment of the present invention showing the aspect ratio of cooling gas channel.

Then, refer to FIG. 3 for a cross section view of an aluminum nitride electrostatic chuck according to an embodiment of the present invention showing the aspect ratio of cooling gas channel. As shown in FIG. 3, the groove structure layer 1a is provided with the cooling gas channel 2 having width 2 mm and depth 20~100 μm, that is provided with an outer surface 2a and an inner surface 2b. In addition, the groove structure layer 1a is provided with a wafer protrusion surface 9, an absorbed object 7 (usually a silicon wafer), a contact surface 3 between the electrostatic chuck and the wafer; and channel surface 5b. Moreover, the embedded electrodes for the dielectric insulation layer 1b of the aluminum nitride electrostatic chuck 1 include a tungsten electrode 8.

Figure 4:
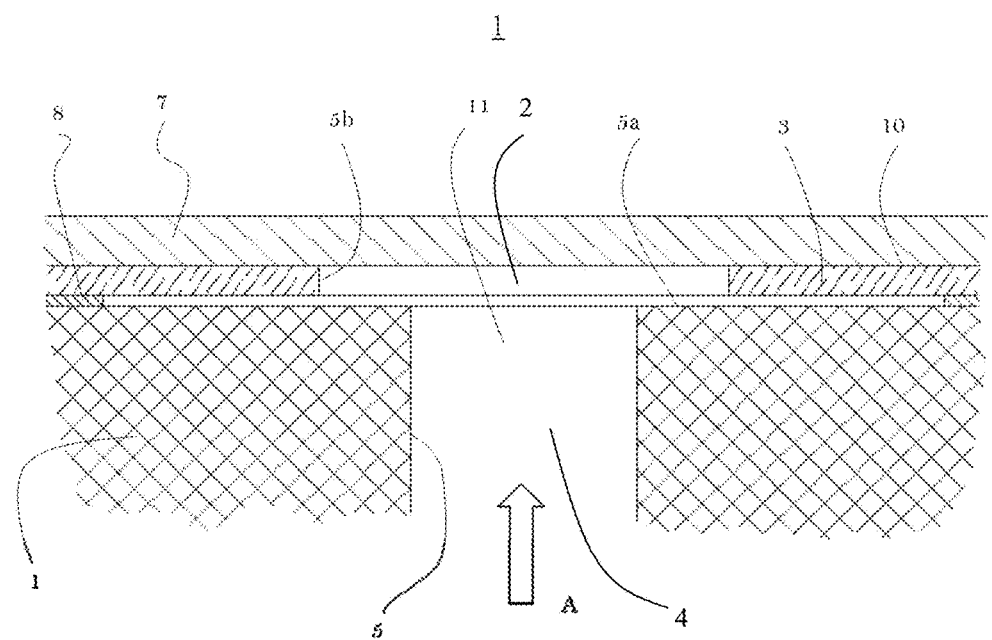
FIG. 4 is a schematic diagram of a cooling gas flow for an aluminum nitride electrostatic chuck according to an embodiment of the present invention.

Finally, refer to FIG. 4 for a schematic diagram of a cooling gas flow for an aluminum nitride electrostatic chuck according to an embodiment of the present invention. As shown in FIG. 4, cool air enters into the groove structure layer 1a through a cooling gas inlet 4, and then the cool air flows into the entire groove structure layer 1a through the cooling gas channel 2, in achieving heat dissipation for the electrostatic chuck. Also, a wafer contact lower surface 10 and a wafer elevation inlet channel 11 are provided, to facilitate absorbing the wafer.

In the following, embodiments 1 to 4 are described in detail with reference to FIGS. 1 to 4.

In the first embodiment, the present invention provides an aluminum nitride electrostatic chuck used in a high temperature and high plasma power density semiconductor manufacturing process. The aluminum nitride electrostatic chuck 1 includes a positioning electrostatic chuck, with its whole set formed by sintering of aluminum nitride, comprising: a groove structure layer 1a, with its surface provided with cooling gas channels 2, having width (W) 2 mm and depth (D) 20 μm, and is used to absorb/release wafer, to control heat distribution of the absorbed wafer; an aluminum nitride dielectric insulation layer 1b, having one or more embedded high voltage electrodes, wherein the electrode includes electric conduction metal composite material, used to provide voltage from 2.0 KV to 3.0 KV to produce electrostatic force to absorb wafer; and a heat conduction layer 1c made of aluminum nitride, having embedded water channels, to enhance temperature reduction of wafer. The aluminum nitride electrostatic chuck 1 further includes a carrier structure 1d made of metal, preferably aluminum, and is disposed below the positioning electrostatic chuck as a support for the positioning electrostatic chuck. The aluminum nitride electrostatic chuck 1 is performed in a condition having the following parameters: voltage applied 3.0 KV, cooling gas pressure 10 Torr, heat conduction coefficient 460 W/mK for surface of electrostatic chuck, and heat temperature difference ±10.8° C.

In the second embodiment, the present invention provides an aluminum nitride electrostatic chuck used in a high temperature and high plasma power density semiconductor manufacturing process. The aluminum nitride electrostatic chuck 1 includes a positioning electrostatic chuck, with its whole set formed by sintering of aluminum nitride, comprising: a groove structure layer 1a, with its surface provided with cooling gas channels 2, having width (W) 2 mm and depth (D) 40 μm, and is used to absorb/release wafer, to control heat distribution of the absorbed wafer; an aluminum nitride dielectric insulation layer 1b, having one or more embedded high voltage electrodes, wherein the electrode includes electric conduction metal composite material, used to provide voltage from 2.0 KV to 3.0 KV to produce electrostatic force to absorb wafer; and a heat conduction layer 1c made of aluminum nitride, having embedded water channels to enhance temperature reduction of wafer. The aluminum nitride electrostatic chuck 1 further includes a carrier structure 1d made of metal, preferably aluminum, and is disposed below the positioning electrostatic chuck as a support for the positioning electrostatic chuck. The aluminum nitride electrostatic chuck 1 is performed in a condition having the following parameters: voltage applied 3.0 KV, cooling gas pressure 10 Torr, heat conduction coefficient 405 W/mK for surface of electrostatic chuck, and heat temperature difference ±10.85° C.

In the third embodiment, the present invention provides an aluminum nitride electrostatic chuck used in a high temperature and high plasma power density semiconductor manufacturing process. The aluminum nitride electrostatic chuck 1 includes a positioning electrostatic chuck, with its whole set formed by sintering of aluminum nitride, comprising: a groove structure layer 1a, with its surface provided with cooling gas channels 2, having width (W) 2 mm and depth (D) 60 μm, and is used to absorb/release wafer, to control heat distribution of the absorbed wafer; an aluminum nitride dielectric insulation layer 1b, having one or more embedded high voltage electrodes, wherein the electrode includes electric conduction metal composite material, used to provide voltage from 2.0 KV to 3.0 KV to produce electrostatic force to absorb wafer; and a heat conduction layer 1c made of aluminum nitride, having embedded water channels to enhance temperature reduction of wafer. The aluminum nitride electrostatic chuck 1 further includes a carrier structure 1d made of metal, preferably aluminum, and is disposed below the positioning electrostatic chuck as a support for the positioning electrostatic chuck. The aluminum nitride electrostatic chuck 1 is performed in a condition having the following parameters: voltage applied 3.0 KV, cooling gas pressure 10 Torr, heat conduction coefficient 375 W/mK for surface of electrostatic chuck, and heat temperature difference ±10.9° C.

In the fourth embodiment, the present invention provides an aluminum nitride electrostatic chuck used in a high temperature and high plasma power density semiconductor manufacturing process. The aluminum nitride electrostatic chuck 1 includes a positioning electrostatic chuck, with its whole set formed by sintering of aluminum nitride, comprising: a groove structure layer 1a, with its surface provided with cooling gas channels 2, having width (W) 2 mm and depth (D) 80 μm, and is used to absorb/release wafer, to control heat distribution of the absorbed wafer; an aluminum nitride dielectric insulation layer 1b, having one or more embedded high voltage electrodes, wherein the electrode includes electric conduction metal composite material, used to provide voltage from 2.0 KV to 3.0 KV to produce electrostatic force to absorb wafer; and a heat conduction layer 1c made of aluminum nitride, having embedded water channels to enhance temperature reduction of wafer. The aluminum nitride electrostatic chuck 1 further includes a carrier structure 1d made of metal, preferably aluminum, and is disposed below the positioning electrostatic chuck as a support for the positioning electrostatic chuck. The aluminum nitride electrostatic chuck 1 is performed in a condition having the following parameters: voltage applied 3.0 KV, cooling gas pressure 10 Torr, heat conduction coefficient 335 W/mK for surface of electrostatic chuck, and heat temperature difference ±10.95° C.

In the fifth embodiment, the present invention provides an aluminum nitride electrostatic chuck used in a high temperature and high plasma power density semiconductor manufacturing process. The aluminum nitride electrostatic chuck 1 includes a positioning electrostatic chuck, with its whole set formed by sintering of aluminum nitride, comprising: a groove structure layer 1a, with its surface provided with cooling gas channels 2, having width (W) 2 mm and depth (D) 100 μm, and is used to absorb/release wafer, to control heat distribution of the absorbed wafer; an aluminum nitride dielectric insulation layer 1b, having one or more embedded high voltage electrodes, wherein the electrode includes electric conduction metal composite material, used to provide voltage from 2.0 KV to 3.0 KV to produce electrostatic force to absorb wafer; and a heat conduction layer 1c made of aluminum nitride, having embedded water channels to enhance temperature reduction of wafer. The aluminum nitride electrostatic chuck 1 further includes a carrier structure 1d made of metal, preferably aluminum, and is disposed below the positioning electrostatic chuck as a support for the positioning electrostatic chuck. The aluminum nitride electrostatic chuck 1 is performed in a condition having the following parameters: voltage applied 3.0 KV, cooling gas pressure 10 Torr, heat conduction coefficient 303 W/mK for surface of electrostatic chuck, and heat temperature difference ±11° C.

The above detailed description of the preferred embodiment is intended to describe more clearly the characteristics and spirit of the present invention. However, the preferred embodiments disclosed above are not intended to be any restrictions to the scope of the present invention. Conversely, its purpose is to include the various changes and equivalent arrangements which are within the scope of the appended claims.

What is claimed is:

1. An aluminum nitride electrostatic chuck used in high temperature and high plasma power density semiconductor manufacturing process, which includes:
    a positioning electrostatic chuck, with its whole set formed by sintering of aluminum nitride, comprising:
    a groove structure layer, with its surface provided with cooling gas channels, having width 2 mm and depth of 20 to 100 μm, is used to absorb/release wafer, and control heat distribution of the absorbed wafer;
    a dielectric insulation layer, having one or more embedded high voltage electrodes, wherein the electrode includes electric conduction metal composite material, used to provide voltage to produce electrostatic force to absorb wafer;
    a heat conduction layer, having embedded water channels, to enhance temperature reduction of wafer; and
    a carrier structure, made of metal, and is disposed below the positioning electrostatic chuck as a support for the positioning electrostatic chuck.

2. The aluminum nitride electrostatic chuck used in high temperature and high plasma power density semiconductor manufacturing process as claimed in claim 1, wherein the one or more high voltage electrodes embedded in the dielectric insulation layer includes an electric conduction metal composite material, while voltage applied is in a range of 2.0 Kv to 3.0 Kv.

\* \* \* \* \*